(12) United States Patent
Katayama et al.

(10) Patent No.: US 10,615,508 B2
(45) Date of Patent: Apr. 7, 2020

(54) THERMOPLASTIC RESIN COMPOSITION FOR MOLDED ARTICLE HAVING CAPABILITY OF SHIELDING MILLIMETER WAVES

(71) Applicant: DAICEL POLYMER LTD., Minato-ku, Tokyo (JP)

(72) Inventors: Hiroshi Katayama, Himeji (JP); Koji Nishikawa, Tokyo (JP)

(73) Assignee: DAICEL POLYMER LTD., Minato-ku, Tokyo (JP)

( * ) Notice: Subject to any disclaimer, the term of this patent is extended or adjusted under 35 U.S.C. 154(b) by 0 days.

(21) Appl. No.: 14/892,120

(22) PCT Filed: Apr. 24, 2014

(86) PCT No.: PCT/JP2014/061505
§ 371 (c)(1),
(2) Date: Nov. 18, 2015

(87) PCT Pub. No.: WO2014/192470
PCT Pub. Date: Dec. 4, 2014

(65) Prior Publication Data
US 2016/0111792 A1    Apr. 21, 2016

(30) Foreign Application Priority Data

May 30, 2013 (JP) .................................. 2013-113883
Apr. 7, 2014 (JP) .................................. 2014-078311

(51) Int. Cl.
*C08K 7/06* (2006.01)
*C08K 9/02* (2006.01)
(Continued)

(52) U.S. Cl.
CPC ............ *H01Q 17/005* (2013.01); *C08J 3/201* (2013.01); *C08J 3/226* (2013.01); *C08K 7/06* (2013.01);
(Continued)

(58) Field of Classification Search
CPC ...... C08K 2201/004; C08K 7/06; C08K 9/02; C08K 7/02; H01Q 17/005; H01Q 1/40;
(Continued)

(56) References Cited

U.S. PATENT DOCUMENTS 5,273,819 A * 12/1993 Jex .......................... B29C 70/14
264/172.11
5,520,867 A    5/1996 Shirai et al.
(Continued)

FOREIGN PATENT DOCUMENTS

CN    102786797 A    11/2012
EP    0 628 392 A1    12/1994
(Continued)

OTHER PUBLICATIONS

Extended European Search Report for corresponding application No. 14803743.5, dated Dec. 7, 2016 (9 pgs).
(Continued)

*Primary Examiner* — Ling Siu Choi
*Assistant Examiner* — Ronald Grinsted
(74) *Attorney, Agent, or Firm* — Flynn Thiel, P.C.

(57) ABSTRACT

A thermoplastic resin composition capable of providing a molded article that is excellent in its capability of shielding millimeter waves. A thermoplastic resin composition for a molded article having a capability of shielding millimeter waves, containing (A) a thermoplastic resin and (B) carbon long fibers having a fiber length of from 3 to 30 mm in an amount of from 0.5 to 5% by mass. A molded article obtained from the composition is excellent in its capability (Continued)

of shielding millimeter waves and can be used as a protective member for a transmitting and receiving antenna of a millimeter wave radar.

7 Claims, 2 Drawing Sheets

(51) Int. Cl.
  H01Q 17/00    (2006.01)
  C08J 3/20     (2006.01)
  C08J 3/22     (2006.01)
  C08L 101/00   (2006.01)
  H01Q 1/40     (2006.01)
  H05K 9/00     (2006.01)
  G01S 13/931   (2020.01)
  G01S 7/02     (2006.01)

(52) U.S. Cl.
  CPC .............. C08K 9/02 (2013.01); C08L 101/00 (2013.01); H01Q 1/40 (2013.01); H05K 9/0073 (2013.01); H05K 9/0083 (2013.01); C08J 2323/12 (2013.01); C08J 2367/02 (2013.01); C08J 2369/00 (2013.01); C08J 2377/00 (2013.01); C08K 2201/004 (2013.01); G01S 13/931 (2013.01); G01S 2007/027 (2013.01); G01S 2013/9327 (2020.01)

(58) Field of Classification Search
  CPC ........ C08J 3/201; C08J 3/226; C08J 2323/12; C08J 2367/02; C08J 2369/00; C08J 2377/00; C08L 101/00; H05K 9/0073; H05K 9/0083; G01S 2013/9377; G01S 13/931; G01S 2007/027
  USPC ....................................................... 524/495
  See application file for complete search history.

(56) References Cited

U.S. PATENT DOCUMENTS

| | | | |
|---|---|---|---|
| 5,534,210 | A | 7/1996 | Shirai et al. |
| 5,658,513 | A | 8/1997 | Amaike et al. |
| 6,051,307 | A | 4/2000 | Kido et al. |
| 2004/0227663 | A1 | 11/2004 | Suzuki et al. |
| 2010/0097263 | A1 | 4/2010 | Vacanti |
| 2013/0177765 | A1* | 7/2013 | Lim ............... H05K 9/009 428/407 |
| 2014/0070982 | A1 | 3/2014 | Inada et al. |

FOREIGN PATENT DOCUMENTS

| | | |
|---|---|---|
| JP | 06-002344 B2 | 1/1994 |
| JP | 06-114832 A | 4/1994 |
| JP | 06-293023 A | 10/1994 |
| JP | 06-313050 A | 11/1994 |
| JP | 07-205317 A | 8/1995 |
| JP | 07-216104 A | 8/1995 |
| JP | 07-251437 A | 10/1995 |
| JP | 08-118490 A | 5/1996 |
| JP | 2004-502816 A | 1/2004 |
| JP | 2004-231910 A | 8/2004 |
| JP | 2006-274061 A | 10/2006 |
| JP | 2007-074662 A | 3/2007 |
| JP | 2007-176227 A | 7/2007 |
| JP | 2008-150485 A | 7/2008 |
| JP | 2008-540818 A | 11/2008 |
| JP | 2010-101890 A | 5/2010 |
| JP | 2011-057811 A | 3/2011 |
| JP | 2012-236944 A | 12/2012 |
| WO | 02/02686 A2 | 1/2002 |
| WO | 02/02686 A3 | 1/2002 |
| WO | 2012/144150 A1 | 10/2012 |

OTHER PUBLICATIONS

"KEC Jouhou" (KEC Information), No. 225, Apr. 2013, pp. 36-41 (No English Available).
English translation of the International Preliminary Report on Patentability dated Dec. 1, 2015 (1 page).
English translation of Written Opinion of the International Searching Authority dated Jun. 3, 2014 (7 pages).
International Search Report for PCT/JP2014/061505 (2 pgs.).
Chinese Office Action of corresponding Chinese patent application No. 201480031078.8, dated Dec. 30, 2016 (6 pages).
Chinese Office Action for corresponding application No. 201480031078.8, dated Apr. 16, 2018 (7 pages).
*Compounding Composite Material of Polyamide with Stainless Steel Fibers for Electromagnetic Shielding Effectiveness*, including English language Abstract, by Hu et al, Department of Material and Fiber, Nanya Institute of Technology School, Jhongli City, Taiwan, 2011, pp. 29-33 (5 pages).
Japanese Office Action for corresponding application No. 2018-201399, dated Aug. 20, 2019 (4 pages).

* cited by examiner

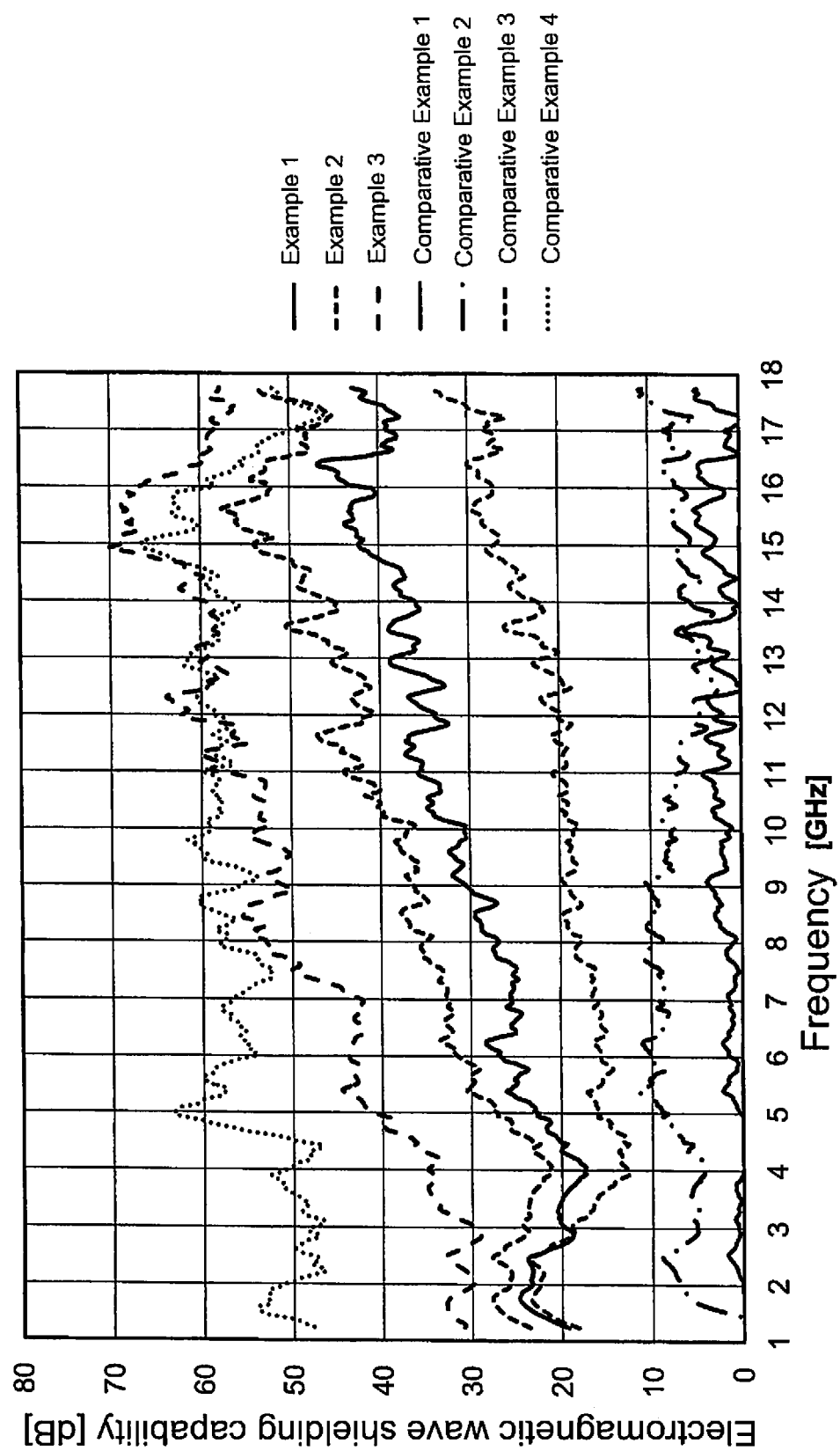

THERMOPLASTIC RESIN COMPOSITION FOR MOLDED ARTICLE HAVING CAPABILITY OF SHIELDING MILLIMETER WAVES

FIELD OF THE INVENTION

The present invention relates to a thermoplastic resin composition for a molded article having a capability of shielding millimeter waves suitable for a millimeter wave radar, and a molded article obtained therefrom.

BACKGROUND OF THE INVENTION

A millimeter wave radar is being utilized for the purposes of automated driving and collision prevention of automobiles.

A millimeter wave radar device is mounted on the front of an automobile, and is equipped with a high frequency module having installed therein an antenna for transmitting and receiving electromagnetic waves, a control circuit for controlling the electromagnetic waves, a housing having the antenna and the control circuit housed therein, and a radome covering the antenna for transmitting and receiving electromagnetic waves (see Background Art of JP-A No. 2007-74662).

The millimeter wave radar device thus constituted transmits and receives millimeter waves with the antenna, so as to detect the relative distance and the relative velocity with respect to the obstacle and the like.

The antenna may receive the electromagnetic waves that are reflected by the road surface and the like other than the target obstacle in some cases, which may provide a possibility of deteriorating the detection accuracy of the device.

For solving this problem, the millimeter wave radar device of JP-A No. 2007-74662 is provided with a shielding member that shields electromagnetic waves between the antenna and the control circuit.

There is described that the shielding member may be an electromagnetic wave absorbing material formed by laminating an electroconductive layer on one of a dielectric loss layer and a magnetic loss layer having a larger dielectric loss than the radome.

There is described that the dielectric loss layer may be formed of at least one carbon material selected from carbon nanotubes, carbon microcoils, shungite carbon, carbon black, expanded graphite, and carbon fibers (see paragraph 0023).

There is described that the magnetic loss layer may be formed of hexagonal ferrite (see paragraph 0023).

There is further described that the dielectric loss layer or the magnetic loss layer preferably contains a substance (an insulating polymer material or an insulating inorganic material) having a higher electric resistivity than the carbon material or the hexagonal ferrite (see paragraph 0024).

SUMMARY OF THE INVENTION

A problem to be solved by the present invention is to provide a thermoplastic resin composition for a molded article having a capability of shielding millimeter waves, and a molded article obtained therefrom.

As a measure for solving the problem, the present invention provides a thermoplastic resin composition for a molded article having a capability of shielding millimeter waves, containing (A) a thermoplastic resin and (B) carbon long fibers having a fiber length of from 3 to 30 mm in an amount of from 0.5 to 5% by mass.

As a measure for solving other problems, the present invention provides a molded article having a capability of shielding millimeter waves, containing the above-mentioned thermoplastic resin composition, carbon fibers derived from the carbon long fibers as the component (B) remaining in the molded article having a weight average fiber length of 1 mm or more, and the molded article having a surface resistivity in a range of from $1 \times 10^5$ to $10^9 \Omega$ per square.

The molded article obtained from the thermoplastic resin composition of the present invention is excellent in its capability of shielding millimeter waves, and is suitable particularly to a protective member for a transmitting and receiving antenna of a millimeter wave radar.

BRIEF DESCRIPTION OF DRAWINGS

FIG. 2 is a graph showing the measurement results of the electromagnetic wave shielding capability in Examples and Comparative Examples.

DETAILED DESCRIPTION OF THE INVENTION

Thermoplastic Resin Composition

Figure 1:
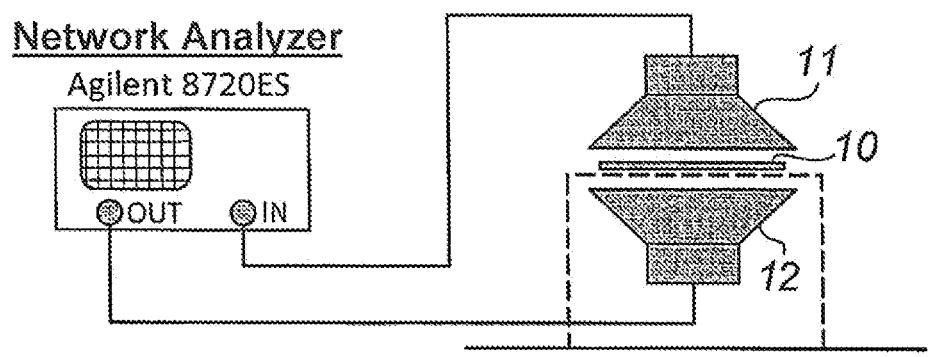
FIG. 1 is an illustrative diagram of the measurement method of a capability of shielding millimeter waves (electromagnetic wave shielding capability).

The thermoplastic resin as the component (A) is not particularly limited, and may be appropriately selected depending on the purpose.

Preferred examples of the component (A) include one selected from polypropylene, aliphatic polyamide, aromatic polyamide, polybutylene terephthalate, polycarbonate, and mixtures thereof.

The carbon long fibers as the component (B) may be formed of known ones, such as a polyacrylonitrile series, a pitch series and a rayon series, and polyacrylonitrile carbon long fibers are preferred.

The carbon long fibers as the component (B) include ones having a metal coated on the surface thereof. The method of coating the surface is not particularly limited, and preferred examples thereof include known methods, such as a plating method (for example, electrolytic plating, electroless plating and hot-dip plating), a vacuum vapor deposition method, an ion plating method, a CVD method (for example, thermal CVD, MOCVD and plasma CVD), a PVD method, and a sputtering method. Among these, a plating method is preferably used.

Examples of the metal to be coated on the surface include silver, copper, nickel, and aluminum, and nickel is preferred from the standpoint of the corrosion resistance of the metal layer. The thickness of the metal coated layer is preferably from 0.1 to 1 μm, and more preferably from 0.2 to 0.5 μm.

The carbon long fibers as the component (B) have a fiber length of from 3 to 30 mm for enhancing the capability of shielding millimeter waves, and the fiber length is preferably from 5 to 20 mm, and more preferably from 6 to 15 mm.

The carbon long fibers as the component (B) are preferably those that are obtained in such a manner that carbon fibers having been arranged in the longitudinal direction are integrated through impregnation with the molten thermoplastic resin as the component (A), and are cut into a length of from 3 to 30 mm (i.e., a resin-impregnated carbon long fiber bundle), for enhancing the dispersibility between the component (A) and the component (B).

The resin-impregnated carbon long fiber bundle may be produced by a known production method using a die, to which such production methods may be applied that are described, for example, in paragraph 0019, the reference production example 1 and the like of JP-A No. 2011-57811, paragraph 0007 of JP-A No. 6-313050, and paragraph 0023 of JP-A No. 2007-176227, and also in JP-B No. 6-2344 (a method for producing a resin-coated long fiber bundle and a method for molding the same), JP-A No. 6-114832 (a fiber-reinforced thermoplastic resin structure and a method for producing the same), JP-A No. 6-293023 (a method for producing a long fiber-reinforced thermoplastic resin composition), JP-A No. 7-205317 (a method for taking out a resin bundle and a method for producing a long fiber-reinforced resin structure), JP-A No. 7-216104 (a method for producing a long fiber-reinforced resin structure), JP-A No. 7-251437 (a method for producing a long fiber-reinforced thermoplastic resin composite material and an apparatus for producing the same), JP-A No. 8-118490 (a crosshead die and a method for producing a long fiber-reinforced resin structure), and the like.

A commercially available product, such as Plastron (registered trademark, produced by Daicel Polymer Ltd.), may also be used.

In the case where the resin-impregnated carbon long fiber bundle is used as the component (B), the content of the carbon long fibers as the component (B) in the resin-impregnated carbon long fiber bundle is preferably from 10 to 50% by mass, more preferably from 10 to 40% by mass, and further preferably from 10 to 30% by mass.

The thermoplastic resin as the component (A) that is contained in the resin-impregnated carbon long fiber bundle is counted in the content of the component (A).

The content of the carbon long fibers as the component (B) in the composition is from 0.5 to 5% by mass, preferably from 0.5 to 3% by mass, and more preferably from 0.8 to 2% by mass, for enhancing the capability of shielding millimeter waves.

The thermoplastic resin composition of the present invention may contain known resin additives in such a range that the problem is still capable of being solved.

Examples of the known resin additives include a stabilizer, such as an antioxidant, a heat resistant stabilizer and an ultraviolet ray absorbent, an antistatic agent, a flame retardant, a flame retardation assistant, a colorant, such as a dye and a pigment, a lubricant, a plasticizer, a crystallization promoter, and a crystal nucleating agent.

Molded Article

The molded article of the present invention is a molded article of the above-mentioned thermoplastic resin composition, and the shape, the size and the like thereof may be appropriately selected depending on the purpose.

In the molded article of the present invention, carbon fibers derived from the carbon long fibers as the component (B) remaining therein preferably have a weight average fiber length of 1 mm or more, more preferably 2 mm or more, and further preferably 3 mm or more, for enhancing the capability of shielding millimeter waves (electromagnetic waves within the prescribed frequency band).

The weight average fiber length herein is one that is measured by the method described in the examples.

In the molded article of the present invention, the content of the carbon fibers derived from the carbon long fibers as the component (B) remaining therein that have a fiber length of 1 mm or more is preferably 60% by mass or more, more preferably 70% by mass or more, and further preferably 80% by mass or more.

Moreover, in the molded article of the present invention, the content of the carbon fibers derived from the carbon long fibers as the component (B) remaining therein that have a fiber length of 2 mm or more is preferably 40% by mass or more, more preferably 50% by mass or more, and further preferably 60% by mass or more.

The molded article of the present invention has a capability of shielding millimeter waves, and the capability of shielding millimeter waves thereof may be evaluated by the electromagnetic wave shielding capability (i.e., the penetration inhibition of radiation waves) for millimeter waves (electromagnetic waves within the prescribed frequency band) measured by the measurement method described in the examples.

The electromagnetic wave shielding capability of the molded article of the present invention is preferably 30 dB or more, more preferably 40 dB or more, and further preferably 50 dB or more.

The wavelength range (frequency band) of millimeter waves in the present invention may be from 300 mm (1 GHz) to 1 mm (300 GHz), and more preferably from 20 mm (15 GHz) to 3 mm (100 GHz).

The capability of shielding millimeter waves herein is one that is measured by the method described in the examples.

The molded article of the present invention shows electroconductivity in addition to the capability of shielding millimeter waves due to the large average remaining fiber length thereof as described above, irrespective of the small content of the component (B).

The molded article of the present invention may have a volume resistivity in a range of from $1 \times 10^2$ to $10^9$ $\Omega \cdot m$, and preferably in a range of from $1 \times 10^3$ to $10^8$ $\Omega \cdot m$.

The molded article of the present invention has a surface resistivity in a range of from $1 \times 10^5$ to $10^9 \Omega$ per square, and preferably in a range of from $1 \times 10^6$ to $10^8 \Omega$ per square.

The molded article of the present invention may be produced by subjecting the above-mentioned thermoplastic resin composition to a known resin molding method, such as injection molding and press molding.

The molded article of the present invention is suitable for a millimeter wave radar, and particularly suitable for a protective member for a transmitting and receiving antenna of a millimeter wave radar.

EXAMPLES

Production Example 1

Production of Resin-Impregnated Carbon Long Fiber Bundle

A fiber bundle (a bundle of approximately 24,000 fibers) formed of carbon long fibers (Torayca T700SC, tensile strength: 4.9 GPa) was heated to 150° C. with a preliminary heating device and then subjected to a crosshead die.

At this time, molten polypropylene (PMB60A, produced by SunAllomer Ltd.) was fed from a twin screw extruder (cylinder temperature: 280° C.) to the crosshead die, thereby impregnating the fiber bundle with the polypropylene.

Thereafter, the fiber bundle was molded with a molding nozzle at the outlet port of the crosshead die, shaped with a shaping roll, and then cut into a prescribed length with a pelletizer, thereby providing pellets (cylindrical molded articles) having a length of 8 mm.

The length of the carbon long fibers is the same as the pellets. The pellets thus obtained had the carbon long fibers that were in approximately parallel to each other in the longitudinal direction.

Example 1

3% by mass of the pellets obtained in Production Example 1 (content of carbon long fibers: 40% by mass) and 97% by mass of pellets of a polypropylene resin (PMB60A, produced by SunAllomer Ltd.) were used and molded with an injection molding machine (J-150EII, produced by Japan Steel Works, Ltd.) at a molding temperature of 240° C. and a die temperature of 60° C., thereby providing a molded article.

The resulting molded article was subjected to the measurements shown in Table 1.

Examples 2 and 3

Molded articles were obtained in the same manner as in Example 1, except that the pellets obtained in Production Example 1 (content of carbon long fibers: 40% by mass) and the pellets of a polypropylene resin described in Example 1 were blended at the ratios shown in Table 1.

The resulting molded articles were subjected to the measurements shown in Table 1.

Comparative Example 1

The pellets obtained in Production Example 1 (content of carbon long fibers: 40% by mass) were fed to a twin screw extruder (Twin Screw Extruder TEX30α, produced by Japan Steel Works, Ltd.) and again molded into pellets, thereby providing carbon short fiber-containing pellets (cylindrical molded articles).

3% by mass of the short fiber-containing pellets and 97% by mass of pellets of a polypropylene resin (PMB60A, produced by SunAllomer Ltd.) were used and molded with an injection molding machine (J-150EII, produced by Japan Steel Works, Ltd.) at a molding temperature of 240° C. and a die temperature of 60° C., thereby providing a molded article.

The resulting molded article was subjected to the measurements shown in Table 1.

Comparative Examples 2 and 3

Molded articles were obtained in the same manner as in Example 1, except that the carbon short fiber-containing pellets described in Comparative Example 1 (content of carbon long fibers: 40% by mass) and the pellets of a polypropylene resin described in Comparative Example 1 were blended at the ratios shown in Table 1.

Comparative Example 4

A molded article was obtained in the same manner as in Example 1, except that 50% by mass of the pellets obtained in Production Example 1 (content of carbon long fibers: 40% by mass) and 50% by mass of the pellets of a polypropylene resin described in Example 1 were blended and used.

The resulting molded articles were subjected to the measurements shown in Table 1.

(1) Weight Average Fiber Length

A specimen having a weight of approximately 3 g was cut out from the molded article, and carbon fibers in the specimen were extracted by removing the polypropylene through dissolution with sulfuric acid. The weight average fiber length was obtained from a part of the extracted fibers (500 fibers). The calculating expression used therefor was that described in paragraphs 0044 and 0045 of JP-A No. 2006-274061.

(2) Electromagnetic Wave Shielding Capability

The measurement device shown in FIG. 1 was used.

A molded article 10 to be measured (150 mm in length, 150 mm in width, 2 mm in thickness) was held between a pair of antennas facing each other vertically (wideband antenna, Schwarzbeck Mess-Elektronik, BBHA9120A, 2-18 GHz) 11 and 12. The distance between the antenna 12 and the molded article 10 was 85 mm, and the distance between the molded article 10 and the antenna 11 was 10 mm.

In this state, electromagnetic waves (1 to 18 GHz) were emitted from the lower antenna 12, the electromagnetic waves thus passed through the molded article 10 to be measured were received with the upper antenna 11, and the electromagnetic wave shielding capability (i.e., the penetration inhibition of radiation waves) was obtained by the following expression (1).

In the expression (1), $S_{21}$ represents the S parameter (expression (2)) showing the ratio of the transmitted electromagnetic waves and the incident electromagnetic waves, and can be measured with a network analyzer.

In the expression (1), the logarithm of the reciprocal of the S parameter was used for expressing the electromagnetic wave shielding capability (dB) with a positive value. In the measurement device shown in FIG. 1, a range of from 0 to approximately 55 dB can be measured, and the case where the electromagnetic wave shielding capability exceeds the range is expressed by ">55 (dB)" in Table 1.

The measurement results are shown in Table 1, and the changes in the electromagnetic wave shielding capability are shown in FIG. 2.

$$\text{electromagnetic wave shielding capability} = 20 \log(1/|S_{21}|) \text{ (unit: dB)} \quad (1)$$

$$S_{21} = \text{(transmitted electromagnetic waves)/(incident electromagnetic waves)} \quad (2)$$

(3) Tensile Strength (MPa) and Tensile Nominal Strain (%)

The tensile strength and the tensile nominal strain were measured according to JIS K7161.

(4) Density

The density was measured according to ISO 1183.

(5) Surface Resistivity and Volume Resistivity

A specimen having a surface resistivity of $5 \times 10^7 \Omega$ per square or less and a volume resistivity of $2 \times 10^5$ Ω·m or less was measured for the surface resistivity and the volume resistivity according to JIS K7194 with a low resistivity meter (Loresta GP (MCP-T600), produced by Mitsubishi Chemical Corporation).

A specimen having a surface resistivity of $1 \times 10^8 \Omega$ per square or more and a volume resistivity of $1 \times 10^4$ Ω·m or more was measured for the surface resistivity and the volume resistivity according to JIS K6911 with a high resistivity meter (Hiresta UP (MCP-HT450), produced by Mitsubishi Chemical Corporation).

In Table 1, for example, the expression "1.1E+07" in Example 1 means "$1.1 \times 10^7$".

The expressions ">1.0E+13" (Ω per square) and ">1.0E+9" (Ω·m) in Comparative Examples 1 and 2 mean that the resistivities are higher than these values, respectively, since the measurement upper limits of the high resistivity meter are $1 \times 10^{13} \Omega$ per square for the surface resistivity and $1 \times 10^9$ Ω·m for the volume resistivity.

The expression "5-10E+7" (Ω per square) in Examples 1 to 3 means that the surface resistivity is higher than the measurement upper limit of the low resistivity meter and lower than the measurement lower limit of the high resistivity meter.

band of from 1 to 300 GHz, resulting in the carbon fiber-containing resin that functions as a lossy medium, and thus the attenuation constant is increased in a higher frequency in the GHz region to show a larger electromagnetic wave shielding capability.

TABLE 1

| | | Example 1 | Example 2 | Example 3 | Comparative Example 1 | Comparative Example 2 | Comparative Example 3 | Comparative Example 4 |
|---|---|---|---|---|---|---|---|---|
| Composition | PP/CF (long fiber) 40% pellets | 3 | 6.25 | 12.5 | — | — | — | 50 |
| | PP/CF (short fiber) 40% pellets | — | — | — | 3 | 12.5 | 50 | — |
| | PP pellets | 97 | 93.75 | 87.5 | 97 | 87.5 | 50 | 50 |
| | CF content (% by mass) | 1.2 | 2.5 | 5 | 1.2 | 5 | 20 | 20 |
| Molded article | Weight average remaining fiber length of CF (mm) | 3.3 | 3.1 | 2.5 | 0.30 | 0.31 | 0.26 | 2.2 |
| | Ratio of remaining fiber length of 1 mm or more (% by mass) | 88 | 83 | 78 | 1.8 | 1.0 | 0.8 | 54 |
| | Ratio of remaining fiber length of 2 mm or more (% by mass) | 63 | 62 | 45 | 0.0 | 0.0 | 0.0 | 36 |
| | Electromagnetic wave shielding capability (dB) 10 GHz | 30 | 37 | 54 | 1 | 7 | 19 | >55 |
| | 12 GHz | 32 | 41 | >55 | 2 | 5 | 19 | >55 |
| | 14 GHz | 35 | 45 | >55 | 0 | 4 | 22 | >55 |
| | 16 GHz | 40 | 52 | >55 | 2 | 6 | 28 | >55 |
| | Tensile strength (MPa) | 35 | 43 | 55 | 30 | 40 | 82 | 127 |
| | Tensile nominal strain (%) | 3.3 | 2.6 | 2.1 | 5.3 | 2.5 | 2.1 | 2.7 |
| | Density | 0.91 | 0.91 | 0.92 | 0.91 | 0.92 | 1.00 | 1.00 |
| | Volume resistivity (Ω · m) | 1.1E+07 | 1.1E+04 | 1.3E+03 | >1.0E+9 | >1.0E+9 | 1.6E+06 | 1.3E−01 |
| | Surface resistivity (Ω per square) | 5-10E+7 | 5-10E+7 | 5-10E+7 | >1.0E+13 | >1.0E+13 | 5.3E+06 | 6.2E+02 |

In the table, PP represents polypropylene, and CF represents carbon fibers.

For the electromagnetic wave shielding capability, a larger value means a better millimeter wave shielding capability.

It was confirmed from the comparisons between Example 1 and Comparative Example 1 and between Example 3 and Comparative Example 2 that assuming that the same amounts, the use of the longer fibers enhanced the electromagnetic wave shielding capability.

It was confirmed from Comparative Example 3 that the electromagnetic wave shielding capability was enhanced by increasing the content of the short fibers of carbon fibers, but Example 1 was better in the electromagnetic wave shielding capability than Comparative Example 3 irrespective of the fact that Comparative Example 3 used the carbon fibers in an amount of 16 times or more as much as those in Example 1.

It was confirmed from Comparative Example 4 that an electromagnetic wave shielding capability exceeding Examples 1 to 3 was obtained by increasing the content of the carbon long fibers, but this case also used the carbon fibers in an amount of 16 times or more as much as those in Example 1, resulting in an economic disadvantage and an increased density, which was disadvantageous for reducing the weight of the molded article.

While the frequency band shown in Table 1 and FIG. 2 is from 1 to 18 GHz, it has been known that in the case where the electromagnetic wave shielding capability within the range is in the state shown in Table 1 and FIG. 2, the skin depth is sufficiently smaller than the thickness in a frequency This fact can be confirmed, for example, by the description in "KEC Jouhou" (KEC Information), No. 225, April of 2013, pp. 36-41, particularly pp. 39-40 "2.3 Electromagnetic Shielding with Lossy Medium" and "FIG. 9 Shielding Characteristics of Conductive Material with Two-layer Structure".

The invention claimed is:

1. A molded article having a capability of shielding millimeter waves, comprising a thermoplastic resin, carbon fibers having a weight average fiber length of 1 mm or longer, including carbon fibers having a fiber length of from 1 mm to less than 2 mm and carbon fibers having a fiber length of 2 mm or longer, wherein carbon fibers having a fiber length of at least 1 mm are present in an amount of at least 60 mass % and carbon fibers having a fiber length of at least 2 mm are present in an amount of at least 40 mass %, with respect to the total carbon fiber content; wherein
the molded article has a total carbon fiber content of 0.5 to 5% by mass and the mass % of carbon fibers having a fiber length of at least 1 mm is greater than the mass % of carbon fibers having a fiber length of at least 2 mm.

2. The molded article having a capability of shielding millimeter waves according to claim 1, wherein said molded article is formed from pellets cut into a length of from 3-30 mm and comprising carbon fibers integrated through impregnation with the molten thermoplastic resin and arranged in the longitudinal direction of the pellets.

3. The thermoplastic resin composition for a molded article having a capability of shielding millimeter waves according to claim 1, wherein the millimeter waves have a frequency of from 1 to 300 GHz.

4. The molded article having a capability of shielding millimeter waves according to claim 1, wherein the molded article is for a millimeter wave radar.

5. The molded article having a capability of shielding millimeter waves according to claim 1, wherein the molded article is for a protective member for a transmitting and receiving antenna of a millimeter wave radar.

6. The molded article having a capability of shielding millimeter waves according to claim 1, wherein the thermoplastic resin is one selected from polypropylene, aliphatic polyamide, aromatic polyamide, polybutylene terephthalate and polycarbonate.

7. The molded article having a capability of shielding millimeter waves according to claim 1, wherein the molded article has a surface resistivity in a range of $1 \times 10^5$ to $10^9 \Omega$ per square.

* * * * *